(12) United States Patent
English et al.

(10) Patent No.: US 7,903,431 B2
(45) Date of Patent: Mar. 8, 2011

(54) ELECTROMAGNETIC INTERFERENCE SHIELDING APPARATUS

(75) Inventors: Gerald Robert English, Glen Ellyn, IL (US); Paul Crotty, East Stroudsburg, PA (US); Joseph Boetto, Hoffman Estates, IL (US)

(73) Assignee: Laird Technologies, Inc., Chesterfield, MO (US)

( * ) Notice: Subject to any disclaimer, the term of this patent is extended or adjusted under 35 U.S.C. 154(b) by 743 days.

(21) Appl. No.: 11/763,157

(22) Filed: Jun. 14, 2007

(65) Prior Publication Data

US 2008/0310139 A1 Dec. 18, 2008

(51) Int. Cl.
*H05K 9/00* (2006.01)

(52) U.S. Cl. ......... 361/816; 361/785; 361/801; 361/818; 361/800; 174/382

(58) Field of Classification Search .................. 174/382, 174/377; 361/769, 785
See application file for complete search history.

(56) References Cited

U.S. PATENT DOCUMENTS

| | | | |
|---|---|---|---|
| 3,234,318 A | 2/1966 | Lieshout et al. | |
| 3,816,911 A | 6/1974 | Knappenberger | |
| 4,066,837 A * | 1/1978 | Miura | 174/366 |
| 4,754,101 A | 6/1988 | Stickney et al. | |
| 5,354,951 A | 10/1994 | Lange, Sr. et al. | |
| 5,383,098 A | 1/1995 | Ma et al. | |
| 5,422,433 A | 6/1995 | Rivera et al. | |
| 5,436,802 A | 7/1995 | Trahan et al. | |
| 5,495,399 A * | 2/1996 | Gore et al. | 361/814 |
| 5,530,202 A | 6/1996 | Dais et al. | |
| 5,597,259 A | 1/1997 | Bogaerts et al. | |
| 5,895,884 A | 4/1999 | Davidson | |
| 6,136,131 A | 10/2000 | Sosnowski | |
| 6,181,573 B1 * | 1/2001 | Riet | 361/816 |
| 6,377,472 B1 * | 4/2002 | Fan | 361/800 |

(Continued)

FOREIGN PATENT DOCUMENTS

DE 197 32 618 7/1997

(Continued)

OTHER PUBLICATIONS

Removable Shielding Technologies for PCBs, by Thomas Clupper, W.L. Gore and Associates, http://www.evaluationengineering.com/archive/articles/0106/0106emc_shielding.asp, accessed Nov. 21, 2006, 8 pages.

(Continued)

*Primary Examiner* — Hung S Bui
*Assistant Examiner* — Steven Sawyer
(74) *Attorney, Agent, or Firm* — Harness, Dickey & Pierce, P.L.C.

(57) ABSTRACT

A shielding apparatus is disclosed suitable for use in providing electromagnetic interference shielding for an electrical component on a substrate. The shielding apparatus includes a frame that is at least partially drawn in construction and is configured for installation to the substrate. Side walls of the frame generally surround the electrical component, and a cover is attachable to the frame for substantially covering the electrical component. The cover includes an upper surface having an inverted embossment formed therein, and a cover member extending generally downwardly from the upper surface adjacent the inverted embossment. The inverted embossment and cover member define a guide for guiding and receiving at least part of the frame into the guide when the cover is attached to the frame. The guide is configured to help facilitate and generally hold the cover in electrical contact with the frame when the cover is attached to the frame.

19 Claims, 14 Drawing Sheets

U.S. PATENT DOCUMENTS

| | | | |
|---|---|---|---|
| 6,384,324 B2 | 5/2002 | Flego | |
| 6,388,189 B1 * | 5/2002 | Onoue | 174/383 |
| 6,426,459 B1 * | 7/2002 | Mitchell | 174/382 |
| 6,501,016 B1 | 12/2002 | Sosnowski | |
| 6,552,261 B2 | 4/2003 | Shlahtichman et al. | |
| 6,624,353 B2 | 9/2003 | Gabower | |
| 6,649,827 B2 | 11/2003 | West et al. | |
| 6,711,032 B2 | 3/2004 | Sommer | |
| 6,754,088 B2 | 6/2004 | Takeda | |
| 6,937,297 B2 | 8/2005 | Kang et al. | |
| 6,949,706 B2 | 9/2005 | West | |
| 6,992,901 B1 * | 1/2006 | Hung | 361/818 |
| D522,517 S | 6/2006 | Latawiec et al. | |
| 7,109,411 B2 | 9/2006 | Vinokor et al. | |
| 2002/0117315 A1 * | 8/2002 | Gabower | 174/35 R |
| 2002/0185294 A1 | 12/2002 | Shlyakhtichman et al. | |
| 2005/0219832 A1 | 10/2005 | Pawlenko et al. | |
| 2007/0012479 A1 | 1/2007 | Vinokor et al. | |

FOREIGN PATENT DOCUMENTS

| | | |
|---|---|---|
| GB | 2 152 91 | 7/1985 |
| GB | 2 315 923 | 11/1998 |
| WO | WO 95/27390 | 10/1995 |
| WO | WO 00/25563 | 5/2000 |

OTHER PUBLICATIONS http:/www.tech-etch.com/shield/boardlevelshield.html, accessed Jan. 25, 2007, 5 pages.

First Office Action from Chinese patent application No. CN2008800201662 (now published as CN101683024A) which is related to the instant application through a priority claim, dated Dec. 20, 2010; 4 pages.

* cited by examiner

ELECTROMAGNETIC INTERFERENCE SHIELDING APPARATUS

FIELD

The present disclosure relates generally to shielding apparatus for electronic systems and devices, and more particularly to a two-piece shielding apparatus having a drawn frame and a cover configured to receive the drawn frame into contact with the cover to help retain the attachment of the cover to the frame.

BACKGROUND

The statements in this section merely provide background information related to the present disclosure and may not constitute prior art.

Electronic equipment often generates electromagnetic signals in one portion of the electronic equipment that may radiate to and interfere with another portion of the electronic equipment. This electromagnetic interference (EMI) can cause degradation or complete loss of important signals, thereby rendering the electronic equipment inefficient or inoperable. To reduce the adverse effects of EMI, electrically conducting (and sometimes magnetically conducting) material is interposed between the two portions of the electronic circuitry for absorbing and/or reflecting EMI energy. This shielding may take the form of a wall or a complete enclosure and may be placed around the portion of the electronic circuit generating the electromagnetic signal and/or may be placed around the portion of the electronic circuit that is susceptible to the electromagnetic signal. For example, electronic circuits or components of a printed circuit board (PCB) are often enclosed with shields to localize EMI within its source, and to insulate other devices proximal to the EMI source.

As used herein, the term electromagnetic interference (EMI) should be considered to generally include and refer to both electromagnetic interference (EMI) and radio frequency interference (RFI) emissions, and the term "electromagnetic" should be considered to generally include and refer to both electromagnetic and radio frequency from external sources and internal sources. Accordingly, the term shielding (as used herein) generally includes and refers to both EMI shielding and RFI shielding, for example, to prevent (or at least reduce) ingress and egress of EMI and RFI relative to a housing or other enclosure in which electronic equipment is disposed.

SUMMARY

According to various aspects, exemplary embodiments are provided of shielding apparatus suitable for use in providing electromagnetic interference shielding for one or more electrical components on a substrate. In one exemplary embodiment, a shielding apparatus generally includes a frame having side walls defining at least one opening along an upper portion of the frame. The frame is configured for installation to the substrate so that the side walls generally surround the one or more electrical components on the substrate. A cover is attachable to the frame for substantially covering the at least one opening defined by the frame. The cover includes an upper surface having an inverted embossment formed therein, and a cover member extending generally downwardly from the upper surface at a location adjacent the inverted embossment. The inverted embossment and cover member define a guide for guiding and receiving at least part of the frame into the guide when the cover is attached to the frame. The guide may be configured to help facilitate and generally hold the cover in electrical contact with the frame when the cover is attached to the frame. The shielding apparatus may be operable for shielding the one or more electrical components on the substrate that are within an interior cooperatively defined by the frame, the cover, and the substrate.

In another exemplary embodiment, a shielding apparatus generally includes a frame having side walls defining at least one opening along an upper portion of the frame. The frame is configured for installation to the substrate so that the side walls generally surround the one or more electrical components on the substrate. A cover is attachable to the frame for substantially covering the at least one opening defined by the frame. The cover includes an upper surface and a cover member extending generally downwardly from the upper surface. The frame is at least partly drawn in construction and includes a generally outwardly extending draw lip configured for operatively engaging the cover member of the cover for releasably attaching the cover to the frame. The shielding apparatus may be operable for shielding the one or more electrical components on the substrate that are within an interior cooperatively defined by the frame, the cover, and the substrate.

In still another exemplary embodiment, a shielding apparatus generally includes an electrically-conductive frame having side walls defining at least one opening along an upper portion of the frame. The frame is configured for installation to the substrate so that the side walls generally surround the one or more electrical components on the substrate. An electrically-conductive cover is attachable to the frame for substantially covering the at least one opening defined by the frame. The cover includes an upper surface and two or more spaced-apart cover members extending generally downwardly from the upper surface. The frame includes a lip extending generally outwardly of the frame and substantially around the frame. The lip receives at least part of each of the cover members under the lip for at least partly attaching the cover to the frame. The cover and the frame are in electrical contact when the cover is attached to the frame. The shielding apparatus may be operable for shielding the one or more electrical components on the substrate that are within an interior cooperatively defined by the frame, the cover, and the substrate.

Further areas of applicability will become apparent from the description provided herein. It should be understood that the description and specific examples are intended for purposes of illustration only and are not intended to limit the scope of the present disclosure.

DRAWINGS

The drawings described herein are for illustration purposes only and are not intended to limit the scope of the present disclosure in any way.

DETAILED DESCRIPTION

Figure 1:
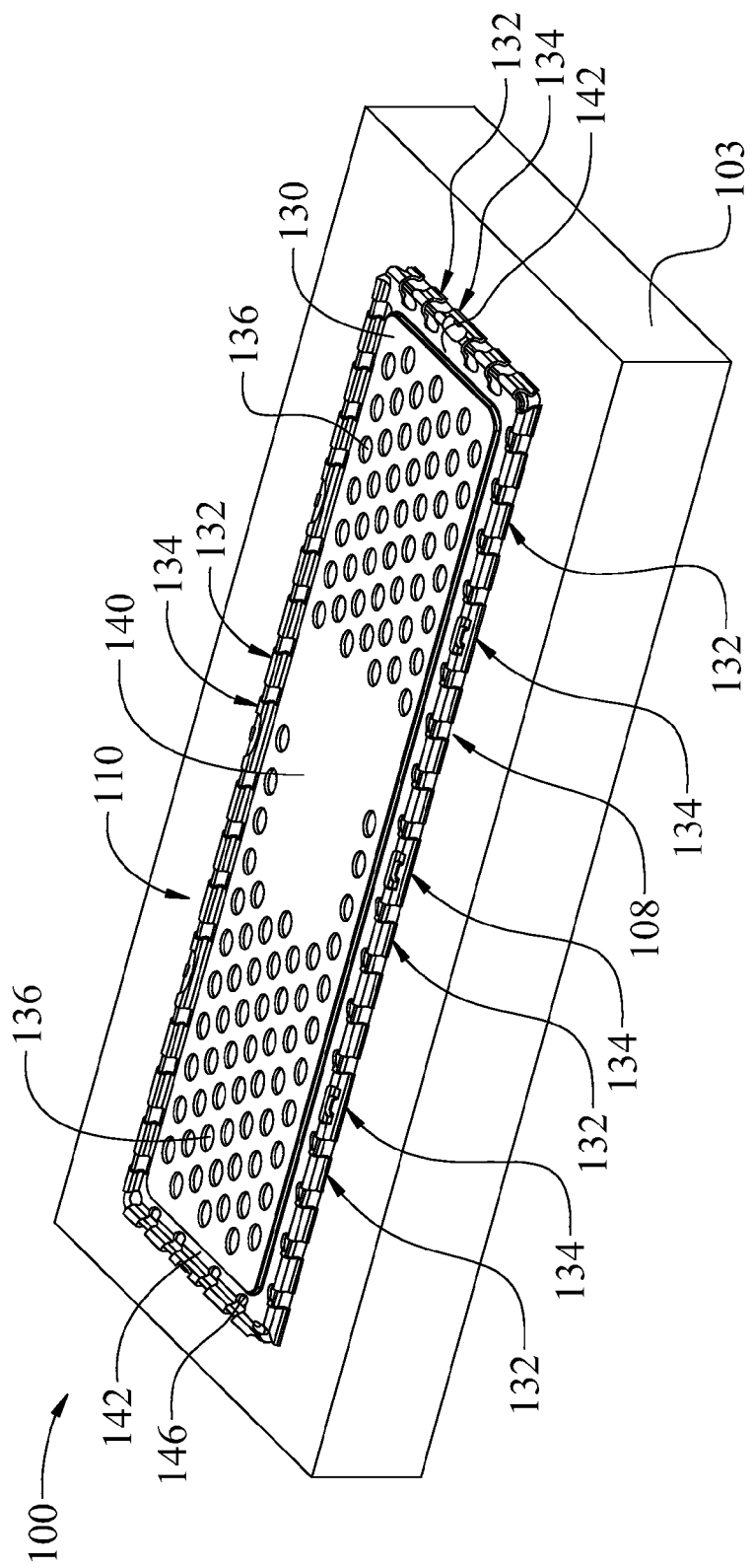
FIG. 1 is a perspective view of an exemplary shielding apparatus mounted on a printed circuit board (PCB) according to one exemplary embodiment.

The following description is merely exemplary in nature and is not intended to limit the present disclosure, application, or uses. It should be understood that throughout the drawings, corresponding reference numerals indicate like or corresponding parts and features.

Figure 2:
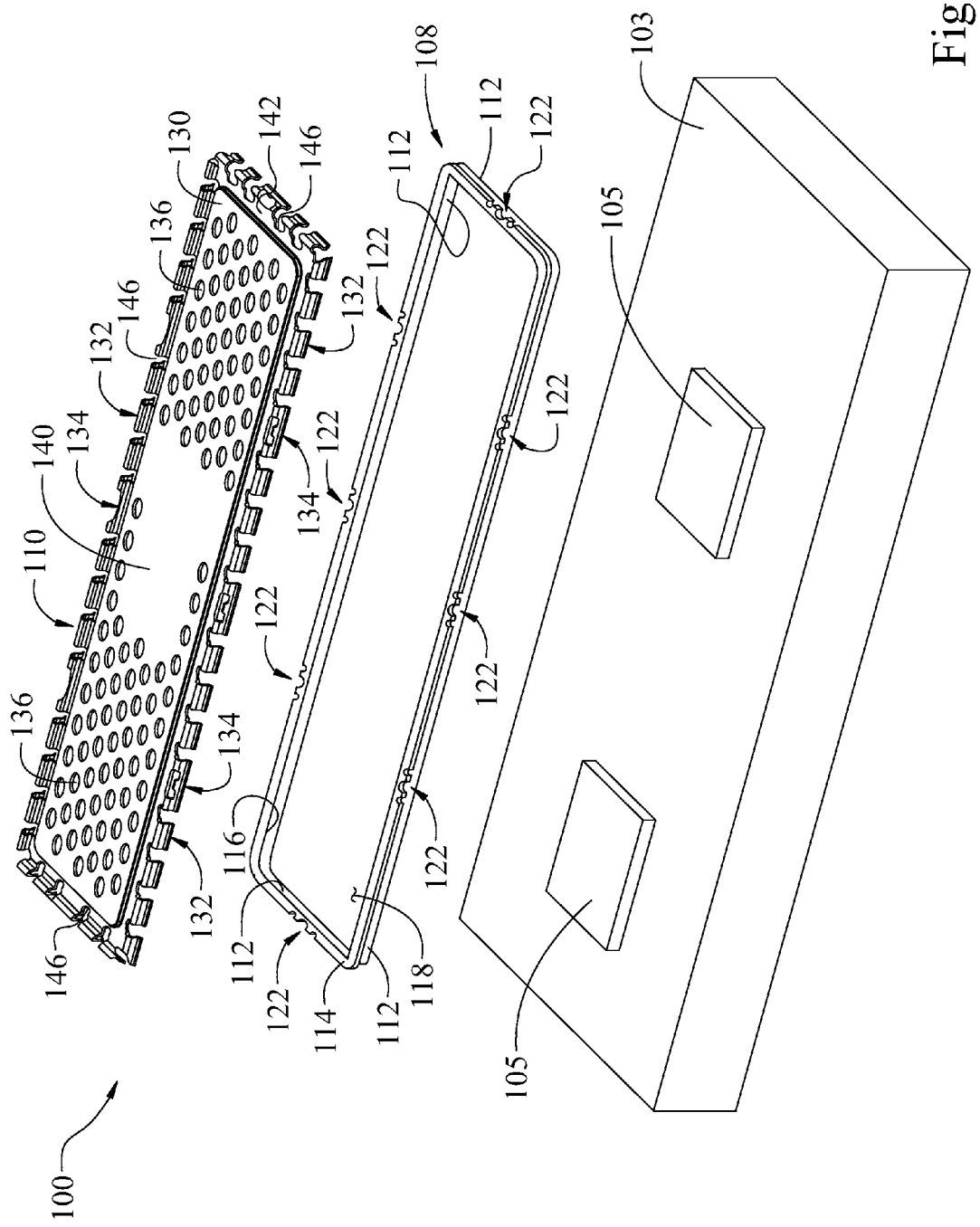
FIG. 2 is an exploded perspective view thereof.

Referring now to the drawings, FIGS. 1 through 9 illustrate an exemplary embodiment of a shielding apparatus 100 embodying one or more aspects of the present disclosure. As shown in FIGS. 1 and 2, the shielding apparatus 100 may be installed to a printed circuit board 103 (a PCB, and broadly a substrate) and is suitable for use in providing electromagnetic interference (EMI) shielding to one or more electrical components 105 mounted on the PCB 103.

The shielding apparatus 100 generally includes a frame 108 and a cover (or lid) 110. In the immediate embodiment, the frame 108 is advantageously formed generally by drawing at least part of the frame 108, for example over a die, to produce the final desired shape of the frame 108. The cover 110 may be formed at least partly by bending, stamping, folding, etc. the cover 110 to produce the final desired shape. The finally shaped frame 108 is configured (e.g., sized, shaped, etc.) to be installed (e.g., surface mounted, secured, etc.) to the PCB 103 by any acceptable means such as soldering, mechanical fastening, etc. And the cover 110 is configured to be releasably attached to the frame 108 so that, together, the frame 108 and the cover 110 can enclose the desired electrical components 105 on the PCB 103 and provide EMI shielding thereto.

The frame 108 is generally rectangular in shape and includes four side walls 112 and an upper lip 114 (FIG. 2) formed integrally (or monolithically) with the side walls 112. The side walls 112 are also integrally formed with each adjacent side wall 112 of the frame 108. The upper lip 114 extends generally outwardly from each of the side walls 112 and generally around the frame 108. The upper lip 114 may be formed, for example, when the frame 108 is drawn such that a generally rounded, or arcuate, draw line 116 may be defined between the frame's drawn upper lip 114 and the frame's side walls 112 (e.g., FIG. 3, etc.). In other exemplary embodiments, shielding apparatus may include frames with lips extending generally outwardly from fewer than all side walls of the frames.

In the illustrated embodiment as shown in FIGS. 1 and 2, the side walls 112 of the frame 108 are substantially planar in shape and are free of openings generally used for attaching the cover 110 to the frame. Adjacent side walls 112 are oriented generally at right angles to each other, and opposing side walls 112 are generally parallel, thereby producing the generally rectangular shape of the frame 108. In other exemplary embodiments, shielding apparatus may include frames with more than or fewer than four side walls and/or side walls in a configuration different from that shown in the figures herein. For example, the side walls may have square configurations, triangular configurations, hexagonal configurations, other polygonal-shaped configurations, circular configurations, non-rectangular configurations, etc. In still other exemplary embodiments, shielding apparatus may include frames with side walls having one or more openings formed therein, for example, for use in attaching covers to the frames.

In addition, the side walls 112 of the frame are configured to generally surround certain electrical components 105 on the PCB 103 when the frame 108 is installed to the PCB 103. In the illustrated shielding apparatus 100, the side walls 112 define an opening 118 along an upper portion of the frame 108 that may be used, for example, to access the certain electrical components 105 on the PCB 103 contained within the frame 108 after the frame is installed to the PCB 103. Thus, the illustrated frame 108 may be viewed as an open-top EMI shielding can. In addition, the illustrated frame 108 is free of interior dividers so that the frame generally defines a single interior space (or compartment) for shielding the one or more electrical components on the PCB 103. In other exemplary embodiments, shielding apparatus may include frames with cross bracing extending between upper portions of side walls of the frames such that the frames include more than one opening along upper portions of the frames. In still other exemplary embodiments, shielding apparatus may include frames with one or more interior dividers attached to side walls of the frame for sectioning the frame into two or more interior spaces.

The frame 108 may be formed from a single piece of electrically-conductive material so that the side walls 112 and upper lip 114 of the frame 108 have the integral, monolithic construction. A wide range of electrically-conductive materials may be used to form the frame 108. By way of example, the frame 108 may be formed from cold rolled steel, nickel-silver alloys, copper-nickel alloys, stainless steel, tin-plated cold rolled steel, tin-plated copper alloys, carbon steel, brass, copper, aluminum, copper-beryllium alloys, phosphor bronze, steel, alloys thereof, or any other suitable electrically-conductive and/or magnetic materials. In addition, the frame 108 may be formed from a plastic material coated with electrically-conductive material. In one exemplary embodiment, a shielding apparatus includes a frame formed from a sheet of cold rolled steel having a thickness of about 0.20 millimeters. As another example, a shielding apparatus may include a frame configured from a suitable material having a thickness in the range of about 0.10 millimeters and about 0.30 millimeters. The materials and dimensions provided herein are for purposes of illustration only, as a frame may be configured from different materials and/or with different dimensions depending, for example, on the particular application, such as the electrical components to be shielded, space considerations within the overall electronic device, EMI shielding and heat dissipation needs, and other factors.

With reference now to FIGS. 1 through 5, the frame 108 of the illustrated shielding apparatus 100 includes locking features 122 formed in the upper lip 114 of the frame 108 generally around a perimeter of the frame 108. The locking features 122 are configured to operatively engage the cover 110 to at least partly retain the attachment of the cover to the frame 108. In the illustrated embodiment, eight locking features 122 are formed in the upper lip 114 of the frame 108, with one locking feature 122 generally centrally located in the upper lip 114 along each longitudinal end of the frame 108 and three locking features 122 generally uniformly spaced in the upper lip 114 along each side of the frame 108. In other exemplary embodiments, shielding apparatus may include frames with more than or less than eight locking features around the frames and/or locking features arranged differently than illustrated in the drawings. In still other exemplary embodiments, shielding apparatus may include frames having no locking features. For example, FIGS. 10 through 14 illustrate an exemplary embodiment of a shielding apparatus 200 in which a frame 208 includes a draw lip 214 free of locking features. This shielding apparatus 200 will be described in more detail hereinafter.

Figure 3:
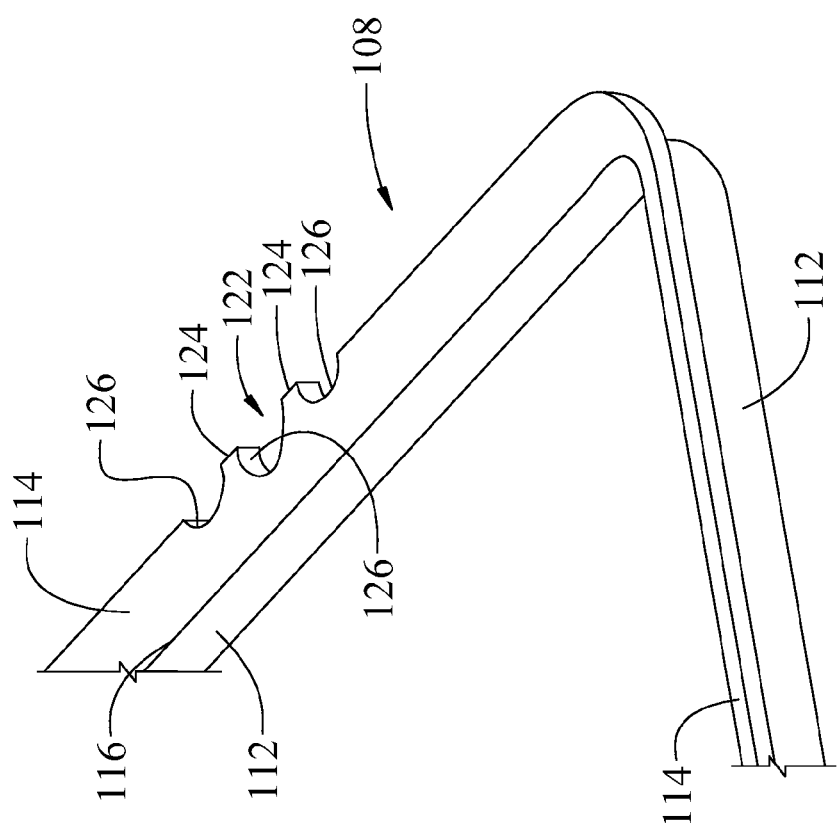
FIG. 3 is an enlarged perspective view of part of a frame of the shielding apparatus of FIG. 1 mounted on the PCB.
Figure 4:
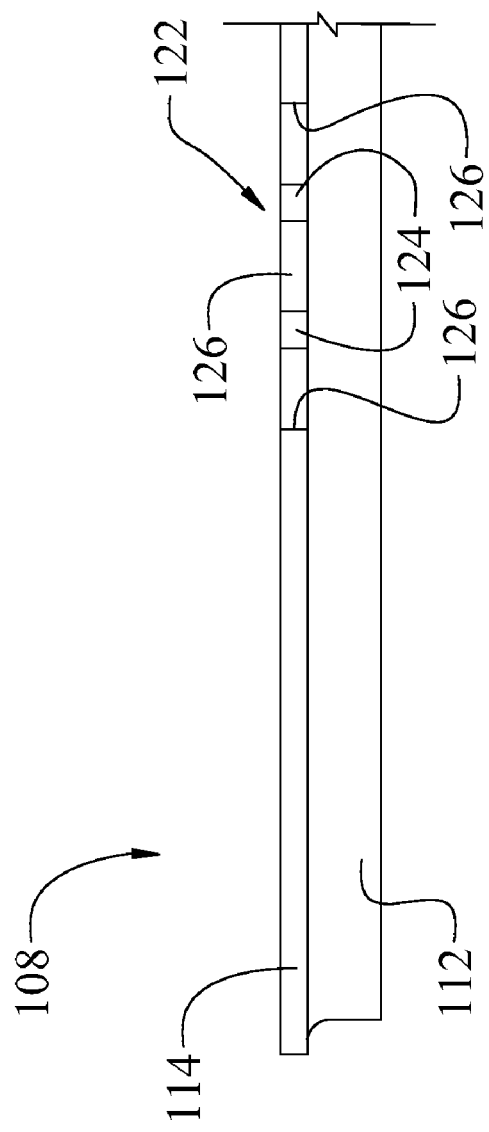
FIG. 4 is a side elevation view thereof.
Figure 5:
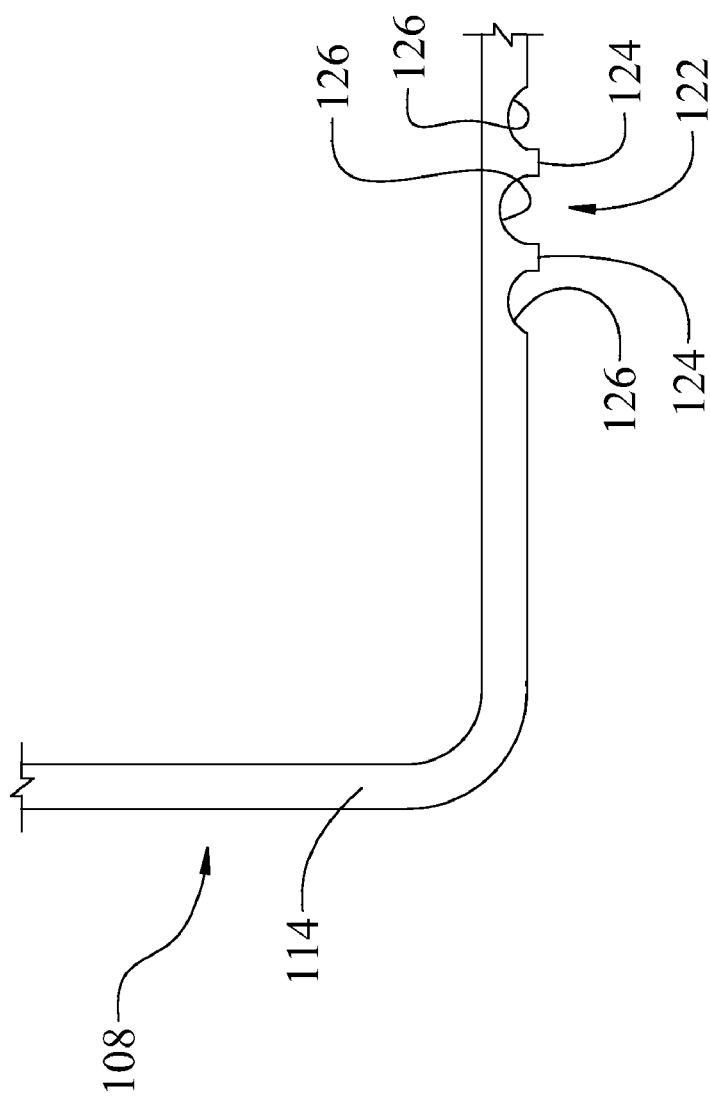
FIG. 5 is a top plan view of the part of the frame shown in FIG. 3.
Figure 6:
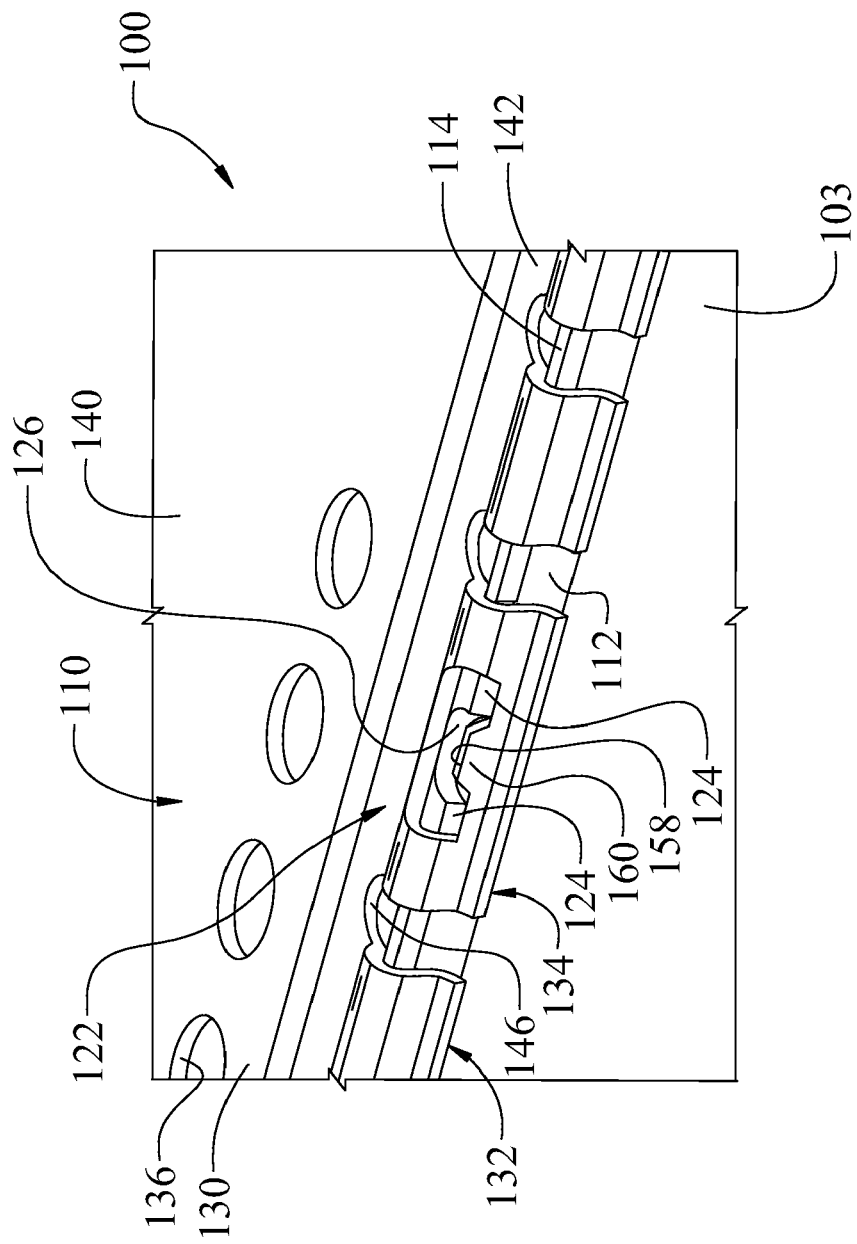
FIG. 6 is an enlarged perspective view of part of the shielding apparatus of FIG. 1 illustrating attachment of a cover to the frame.
Figure 7:
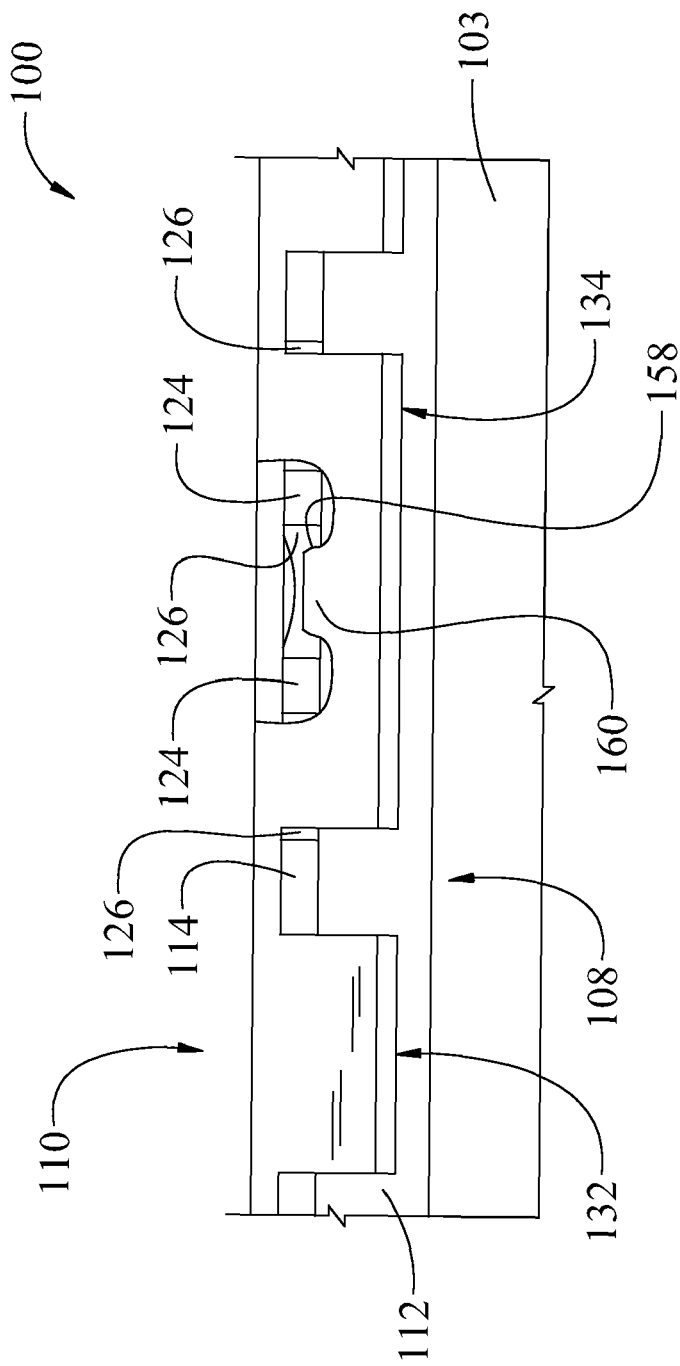
FIG. 7 is a side elevation view thereof.
Figure 8:
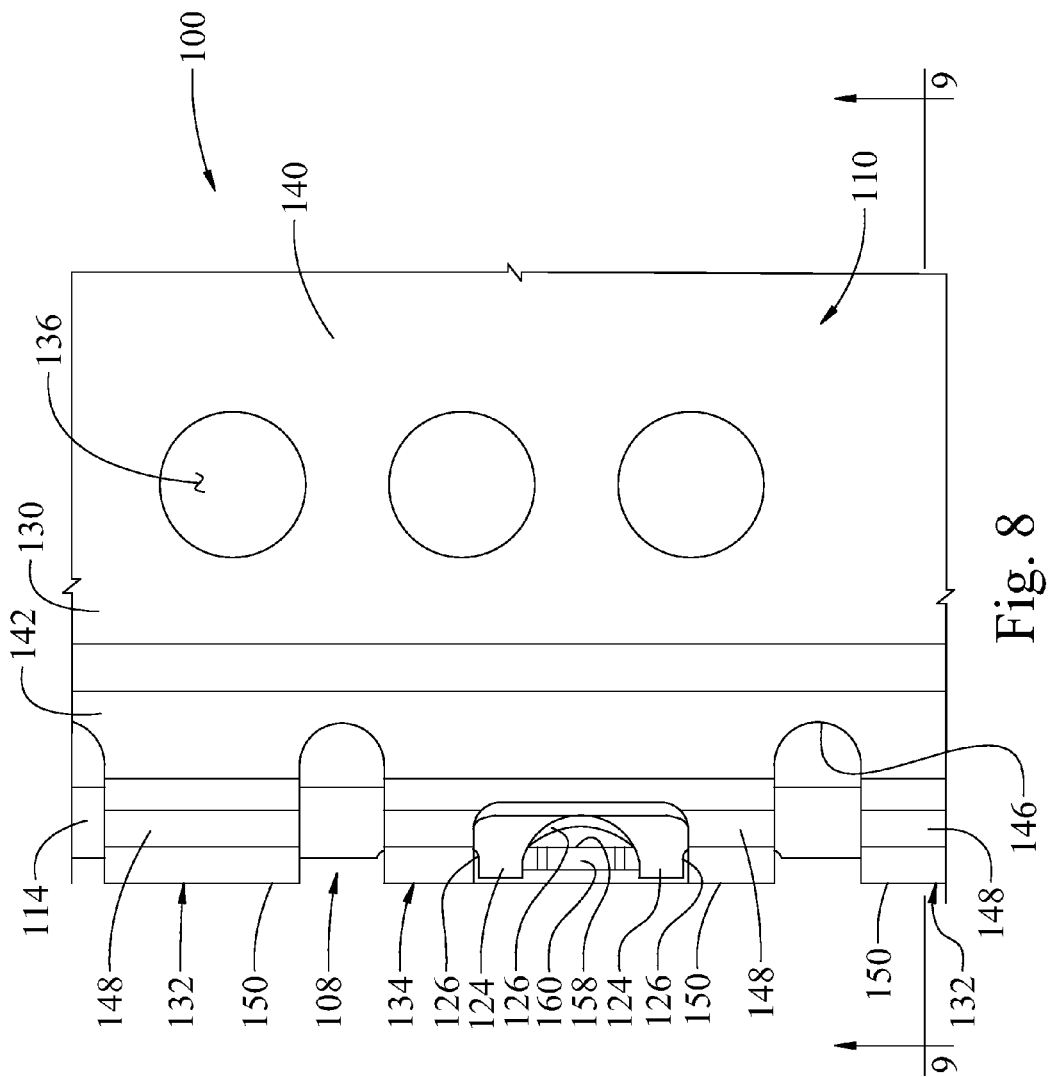
FIG. 8 is a top plan view of the part of the shielding apparatus shown in FIG. 6.

FIGS. 3 through 5 illustrate a single locking feature 122 of illustrated frame 108 located in the upper lip 114 of the frame 108 along a side of the frame 108 and toward a corner of the frame 108. Only one locking feature 122 is shown in FIGS. 3 through 5 and described hereinafter. The other locking features 122 are substantially identical in this embodiment such that a description of the other locking features would essentially be the same. The locking feature 122 includes two locking tabs 124 formed as part of the frame's upper lip 114 (e.g., integrally formed, monolithically formed, etc.), for example, by cutting part of the upper lip at spaced apart locations (e.g., at cutouts 126) so that the locking tabs 124 are defined between the cutouts 126. In the illustrated embodiment, the locking tabs 124 extend generally away from the frame 108 within a plane that also generally contains the frame's upper lip 114. The cutouts 126 are generally formed in the upper lip 114 after the frame 108 is drawn, but they may also alternatively be formed in the upper lip 114 before the frame 108 is drawn within the scope of the present disclosure. In other exemplary embodiments, shielding apparatus may include frames with locking features formed differently than illustrated herein. For example, frames may include locking features formed by folding or bending at least part of the frames to form, for example, locking tabs. In these embodiments, the frames may be free of cutouts, and the locking features may or may not be generally contained within planes that also generally contain upper lips of the frames. In still other exemplary embodiments, shielding apparatus may include frames with locking features having less than or more than two locking tabs. In further embodiments, shielding apparatus may include frames with locking features in which one or more locking features are different from one or more other locking features.

With reference again to FIGS. 1 and 2, the cover 110 of the shielding apparatus 100 is shown with a generally rectangular shape corresponding to the shape of the frame 108. The cover 110 is configured to fit generally over the frame 108 for covering the opening 118 defined by the side walls 112 of the frame 108. At which point, the frame 108 and cover 110 may provide shielding to the one or more electrical components 105 on the PCB 103 disposed within the area cooperatively defined by the frame 108, the cover 110, and the PCB 103. In other exemplary embodiments, shielding apparatus may include covers having shapes different from that shown in the figures herein, but generally corresponding to shapes of frames of the shielding apparatus. For example, covers may have square configurations, triangular configurations, hexagonal configurations, other polygonal-shaped configurations, circular configurations, non-rectangular configurations, etc. Furthermore, covers may include shapes different from shapes of frames within the scope of the present disclosure.

The cover 110 may be formed from a wide range of materials, which are preferably electrically-conductive materials. For example, the cover 110 may be formed from cold rolled steel, nickel-silver alloys, copper-nickel alloys, stainless steel, tin-plated cold rolled steel, tin-plated copper alloys, carbon steel, brass, copper, aluminum, copper-beryllium alloys, phosphor bronze, steel, alloys thereof, or any other suitable electrically-conductive and/or magnetic materials. The cover 110 may also be formed from a plastic material coated with electrically-conductive material. In one exemplary embodiment, a shielding apparatus includes a cover formed from a sheet of cold rolled steel having a thickness of about 0.15 millimeters. As another example, a shielding apparatus may include a cover configured from a suitable material having a thickness in the range of about 0.05 millimeters and about 0.30 millimeters. The materials and dimensions provided herein are for purposes of illustration only, as a cover may be configured from different materials and/or with different dimensions depending, for example, on the particular application, such as the electrical components to be shielded, space considerations within the overall electronic device, EMI shielding and heat dissipation needs, and other factors.

The cover 110 includes an upper surface 130, and multiple spaced apart contact members 132 and retention members 134 (broadly, cover members) extending generally downwardly from the upper surface 130. The contact and retention members 132 and 134 are formed integrally (or monolithically) with the upper surface 130. The upper surface 130, the contact members 132, and the retention members 134 may be formed by one or more of bending, stamping, folding, etc. at least part of the cover 110 to a desired shape. In the illustrated embodiment, the upper surface 130 is generally planar in shape and the contact and retention members 132 and 134 are generally have S-shaped profiles (or cross-sections (FIG. 9)). In other exemplary embodiments, shielding apparatus may include covers having only retention members.

The upper surface 130 of the cover 110 includes a plurality of apertures or holes 136, which may facilitate solder reflow heating interiorly of the cover 110, may enable cooling of the electrical components 105 within the shielding apparatus 100, and/or may permit visual inspection of members of the electrical components 105 beneath the cover 110. In some exemplary embodiments, shielding apparatus may include covers with holes that are sufficiently small to inhibit passage of interfering EMI. The particular number, size, shape, orientation, etc. of the holes may vary depending, for example, on the particular application (e.g., sensitivity of the electronics where more sensitive circuitry may necessitate the use of smaller diameter holes, etc.). For example, some exemplary embodiments of shielding apparatus may include covers without any such holes.

The upper surface 130 of the cover 110 also includes a generally central pick-up surface 140 configured for use in handling the cover 110 with pick-and-place equipment (e.g., vacuum pick-and-place equipment, etc.). The pick-up surface 140 may be configured for use as a pick-up area that may be gripped or to which suction may be applied by the pick-and-place equipment for handling during, for example, fabrication of the cover 110 and/or installation of the cover to the PCB 103. The central location of the pick-up surface 140 may allow for balanced manipulation of the cover 110 during handling of the cover. In other exemplary embodiments, shielding apparatus may include covers with, for example, tabs at corners and/or along side edges for use as pick-up surfaces in addition to or in place of centrally located pick-up surfaces.

With additional reference now to FIGS. 6 through 9, the upper surface 130 of the cover 110 further includes a downwardly protruding (or inverted) embossment. In the illustrated cover 110, the downwardly protruding embossment is shown as a channel 142 (or groove) formed along a general perimeter of the cover's upper surface 130. The channel 142 may be formed in the upper surface 130 by bending, folding, stamping, etc. the cover to the desired shape. The channel 142 has a generally U-shaped profile (or cross-section) and extends substantially around the cover 110 along the general perimeter of the cover's upper surface 130. In other exemplary embodiments, shielding apparatus may include covers with channels that are not located along general perimeters of upper surfaces of the covers. For example, the channels may be located inwardly of the general perimeters of upper surfaces of the covers. In still other exemplary embodiments, shielding apparatus may include covers with channels that extend only partly around the covers. In further exemplary embodiments, shielding apparatus may include covers with channels that are other than U-shaped in profile (or cross-section). For example, channels may be V-shaped in section, box-shaped in profile (or cross-section), etc.

The contact and retention members 132 and 134 of the illustrated cover 110 are positioned generally adjacent the cover's channel 142. More particularly, the contact and retention members 132 and 134 are located generally outwardly of the channel 142 at spaced apart locations along the length of the channel. Cutouts 146 in the cover 110 separate the contact and retention members 132 and 134 along the channel 142. The cutouts 146 may be formed in the cover 110 before the cover is bent, stamped, folded, etc. to shape, or they may be formed in the cover 110 after the cover is bent, stamped, folded, etc. to shape within the scope of the present disclosure.

Figure 9:
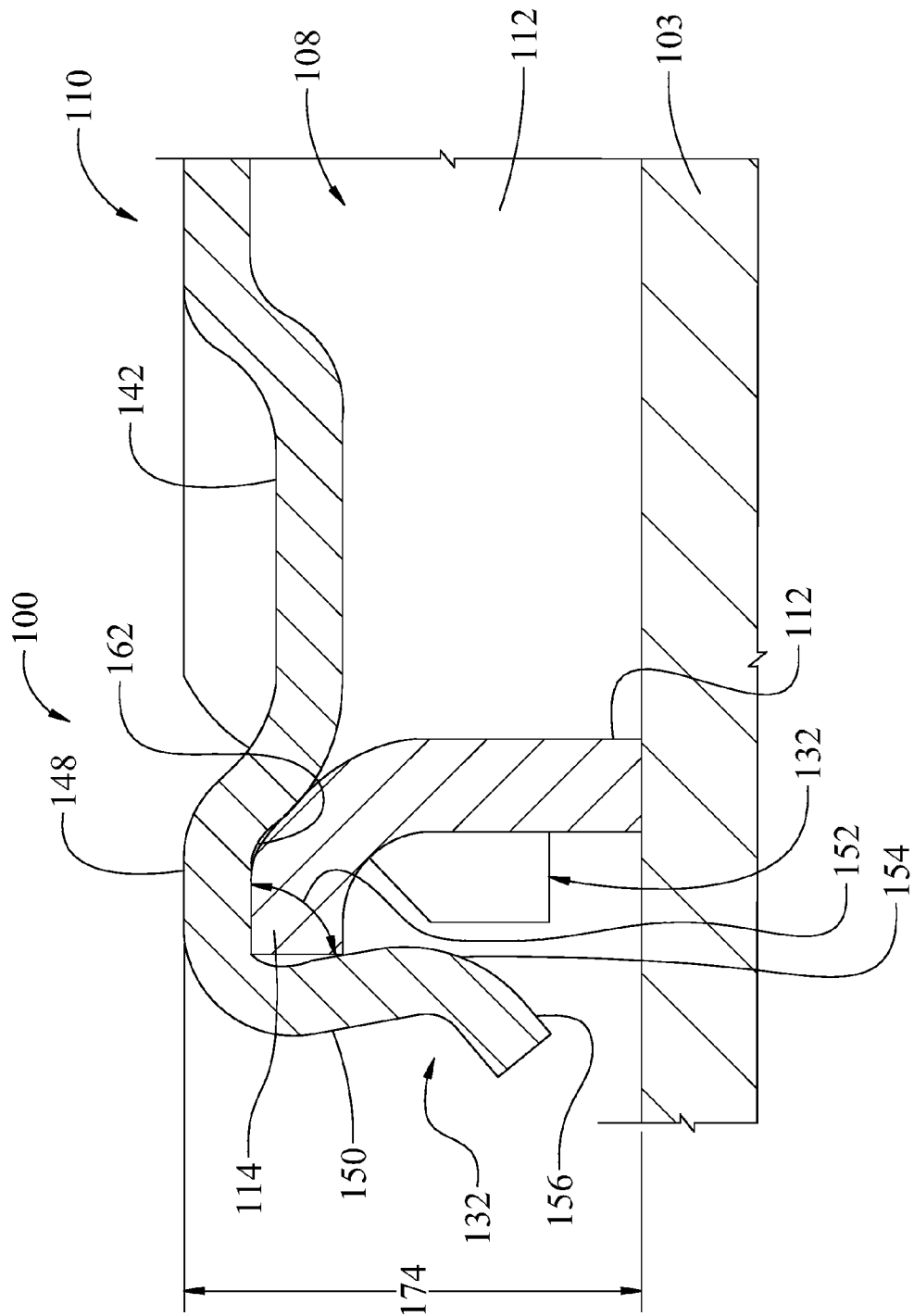
FIG. 9 is a section view of the shielding apparatus of FIG. 1 taken in a plane including line 9-9 of FIG. 8.

As shown in FIG. 9, each contact and retention member 132 and 134 includes a generally horizontal upper portion 148 extending generally away from the channel 142 and a finger 150 extending generally downwardly from the upper portion 148. The upper portion of each contact and retention member 132 and 134 is generally coplanar with the upper surface 130 of the cover 110. The finger 150 of each contact and retention member 132 and 134 extends away from the upper portion 148, generally inwardly of the cover 110. An angle 152 between the upper portion 148 of each contact and retention member 132 and 134 and the finger 150 is generally less than about ninety degrees. In other exemplary embodiments, shielding apparatus may include covers with contact and/or retention members spaced outwardly from channels formed in the covers. For example in one exemplary embodiment, a cover includes a channel formed in an upper surface of the cover generally inwardly of a general perimeter of the upper surface. Contact and retention members are formed in the cover generally along the general perimeter of the cover's upper surface and outwardly spaced from the channel. In this embodiment, at least part of the cover's upper surface is located between the cover's channel and the contact and retention members.

The finger 150 of each contact and retention member 132 and 134 includes a knuckle 154 and a cam surface 156. The knuckle 154 may be viewed as projecting generally inwardly from the finger 150. The cam surface 156 (which is generally located at a free end of the finger 150 below the knuckle 154) extends generally outwardly and downwardly from the knuckle 154. Operation of the knuckle 154 and cam surface 156 in attaching the cover 110 to the frame 108 will be described next.

With continued reference to FIGS. 6 through 9, attachment of the cover 110 to the frame 108 will now be described, which includes a description of the operation of the knuckle 154 and cam surface 156 in attaching the cover 110 to the frame 108. The frame 108 may initially be installed to the PCB 103 so that the upper lip 114 and its locking tabs 124 are generally parallel to the PCB 103. The frame 108, however, may be oriented differently on the PCB 103 within the scope of the present disclosure. The cover 110 may then be positioned over the frame 108 and moved downward onto the frame to facilitate attachment of the cover 110 to the frame 108. With this downward movement, the cam surfaces 156 of the cover's contact and retention members 132 and 134 engage the frame's upper lip 114 and help guide the cover 110 into alignment over the frame 108. The contact and retention members 132 and 134 may be generally resilient in nature so that the free ends (e.g., the cam surfaces 156) of the contact and retention members 132 and 134 may be bent generally outwardly to allow movement of the contact and retention members 132 and 134 past the frame's upper lip 114. In other exemplary embodiments, shielding apparatus may include covers having contact and/or retention members with cam surfaces configured differently than illustrated herein. In still other exemplary embodiments, shielding apparatus may include covers having one or more contact and/or retention members that do not have any of such cam surfaces. For example, one exemplary embodiment includes a shielding apparatus having a cover with one or more contact and/or retention members, the free ends of which do not include any cam surfaces. In other exemplary embodiments, shielding apparatus may include covers having contact and/or retention members utilizing other than cam surfaces for moving the contact and/or retention members over lips of frames. For example, contact and/or retention members may be manually moved to allow placement of covers over frames.

Once the knuckles 154 of the retention members 132 and 134 move past the upper lip 114 of the frame 108, the resilient nature of the contact and retention members 132 and 134 moves the knuckles 154 generally under the upper lip 114 to at least partly hold the cover 110 in attachment with the frame 108. For example in the illustrated embodiment, the knuckles 154 may be positioned inwardly under the upper lip 114 by a distance of about 0.04 millimeters. Alternatively, the knuckles 154 may be positioned inwardly under the upper lip 114 by a distance greater than or less than about 0.04 millimeters within the scope of the present disclosure. In addition, the retention members 134 are located to correspond to the locking features 122 formed in the upper lip 114 of the frame 108. Each of these retention members 134 includes an opening 158 in its finger 150 generally above the knuckle 154, and a retention tab 160 generally within the opening 158. The opening 158 is configured to receive corresponding locking tabs 124 of the upper lip's locking features 122 therethrough to facilitate attachment of the cover 110 to the frame 108. Parts of each retention member 134 may also move partly into the outer cutouts 126 of the upper lip's corresponding locking feature 122. And the retention tab 160 of each retention member 134 may move generally under a central one of the cutouts 126. The cutouts 126 may provide room to access each retention member 134 (e.g., the locking tab 160 of each retention member) from above the cover 110 to facilitate release/disengagement (e.g., by selective caming, etc.) of the retention member 134 from the respective locking feature 122. The resilient nature of the cover's retention members 134 helps hold them in position with the frame's locking features 122.

The upper lip 114 of the frame 108 next moves generally into a guide 162 defined generally under the cover 110 between the cover's channel 142 and the contact and retention members 132 and 134. The guide 162 acts to guide and receive at least part of the frame 108 into the guide 162 when the cover 110 is moved into attachment with the frame 108. More particularly, the guide 162 frictionally receives the upper lip 114 of the frame 108 into the guide 162 when the cover 110 is moved into attachment with the frame 108 to thereby help generally hold the cover 11 0 in electrical and physical contact with the frame 108. In the illustrated embodiment, the guide 162 is defined generally under the upper portions 148 of the contact and retention members 132 and 134 and extends substantially around the cover 110 alongside the channel 142. The upper lip 114 of the frame 108 is received within the guide 162 when the cover 110 attaches to the frame 108. The upper lip 114 may contact the cover 110 generally within the guide 162 under the upper portions 148 of the cover's retention members 132 and 134, as well as at the channel 142 and at the fingers 150 of the contact and retention members 134 (FIG. 9). In addition, a radius of the draw line 116 of the frame 108 may generally match a radius leading into the channel 142 from the upper portions 148 of contact and retention members 132 and 134. This matching or the radii may help further improve fit between the cover 110 and frame 108 (FIG. 9).

When or if the cover 110 of the shielding apparatus 100 is to be detached from the frame 108, the resilient contact and retention members 132 and 134 may be biased outwardly so that the knuckles 154 clear the upper lip 114, and so that the openings 158 in retention members 134 clear the upper lip's locking tabs 124. The cover 110 may then be removed vertically from the frame 108. The contact and retention members 132 and 134 may be biased manually or by automated means when detaching the cover 110 from the frame 108. For example, a shim (or other suitable tool) may be manually positioned through cutouts 126 in retention members 134 and/or between the cover's contact and retention members 132 and 134 and the frame's side walls 112 (e.g., through cutouts 146 between members 132 and 134, etc.) to force the contact and retention members 132 and 134 generally away (e.g., bend, flex, deform, etc.) from the side walls 112. This process may need to be repeated until all of the contact and retention members 132 and 134 are released from the frame 108. It is understood that the contact and retention members 132 and 134 may be configured so as to be preferably resistant to yielding such that the contact and retention members 132 and 134 are capable of being repeatedly moved outward and inward to accommodate multiple and repeated cycles of attachment, detachment, and reattachment of the cover 110 to the frame 108, while also maintaining the capability of squeezing and/or gripping the upper lip 114 of the frame 108. Thus, the resilient nature of the contact and retention members 132 and 134 preferably causing the members to return to their original configuration once the cover 110 is detached from the frame 108 so that the cover 110 may preferably be subsequently reattached to the frame 108.

It should be appreciated that the cover 110 may be attached to, detached from, and subsequently reattached to the frame 108 in a generally vertical direction without impinging on an area outside a general footprint of the frame 108. This may advantageously allow for attaching, detaching, and reattaching the cover 110 to/from the frame 108 in confined areas. Accordingly, less space may be required for installation and removal of the cover 110 to/from the frame 108. For example, the cover 110 may be attached to, detached from, and reattached to the frame 108 without interfering with other electrical components mounted on the PCB 103 outside the frame 108. Particularly, the contact and retention members 132 and 134 can be engaged to and/or released from the upper lip 114 of the frame 108 (and to the tabs 124 of the upper lip 114) generally from vertically above the cover 110.

In addition, the illustrated shielding apparatus 100 includes a generally low profile (e.g., an ultra low height) when the cover 110 is attached to the frame 108. For example, an overall height dimension 174 (FIG. 9) of the shielding apparatus 100, when the cover 110 is attached to the frame 108 (and installed to the PCB 103), may be about 0.85 millimeters. In this attached configuration, the cam surfaces 156 of the contact and retention members 132 and 134 may be spaced about 0.2 millimeters above the PCB 103. In addition, connection of the cover 110 to the frame 108 at the outwardly extending upper lip 114 of the frame may provide optimum area under the cover 110 and within the frame 108 for receiving electrical components 105 therein and for providing shielding to the electrical components. In other exemplary embodiments, shielding apparatus may have overall height dimensions of greater than or less than about 0.85 millimeters. For example, in one exemplary embodiment, a shielding apparatus includes an overall height dimension of about 0.75 millimeters. In another exemplary embodiment, a shielding apparatus includes an overall height dimension of about 1.5 millimeters. In still other exemplary embodiments, shielding apparatus may include covers having contact and/or retention members with cam surfaces spaced greater than or less than about 0.2 millimeters above PCBs when the covers and frames are installed to the PCBs.

As previously stated, the frame 108 of the illustrated shielding apparatus 100 may advantageously be formed generally by drawing at least part of a piece of material, for example over a die, to produce the final desired shape of the frame 108. In some exemplary embodiments, shielding apparatus include frames that are completely formed by drawing pieces of materials to desired shapes. In other exemplary embodiments, shielding apparatus include frames that are partly formed by drawing pieces of materials and partly formed by folding, bending, etc. the pieces of materials. For example, in one exemplary embodiment, a piece of material is drawn to form an upper portion of side walls of a frame and an upper lip integral with the upper portion of the side walls. A lower portion of each side wall of the frame may then be bent or folded to finish forming the frame.

The cover 110 of the present disclosure is also configured for effective attachment to frames that may have size variances resulting during manufacture of the frames. For example, manufacturing processes used for repeatedly producing multiple frames may produce one or more frames with small variations in length and/or width dimensions. The cover 110 may accommodate such variations and still maintain electrical contact between the cover 110 and the frames, and still provide EMI shielding for electrical components 105 contained within the attached cover 110 and frames. The cover 110 of the present disclosure may thus be considered more robust to maintain electrical contact with the frame 108 over a wider range of manufacturing tolerances for individual features of the frame 108 and cover 110. For example, the guide 162 of the cover 110 may be sized generally larger than the upper lip 114 of the frame 108 so that the cover 110 may be attached to frames generally smaller in size than the illustrated frame 108 and/or frames generally larger in size than the illustrated frame 108 (e.g., frames within acceptable tolerances). In addition, the channel 142 may help to reduce gaps/openings between the cover 110 and the frames where the cover 110 contacts the frames.

Figure 10:
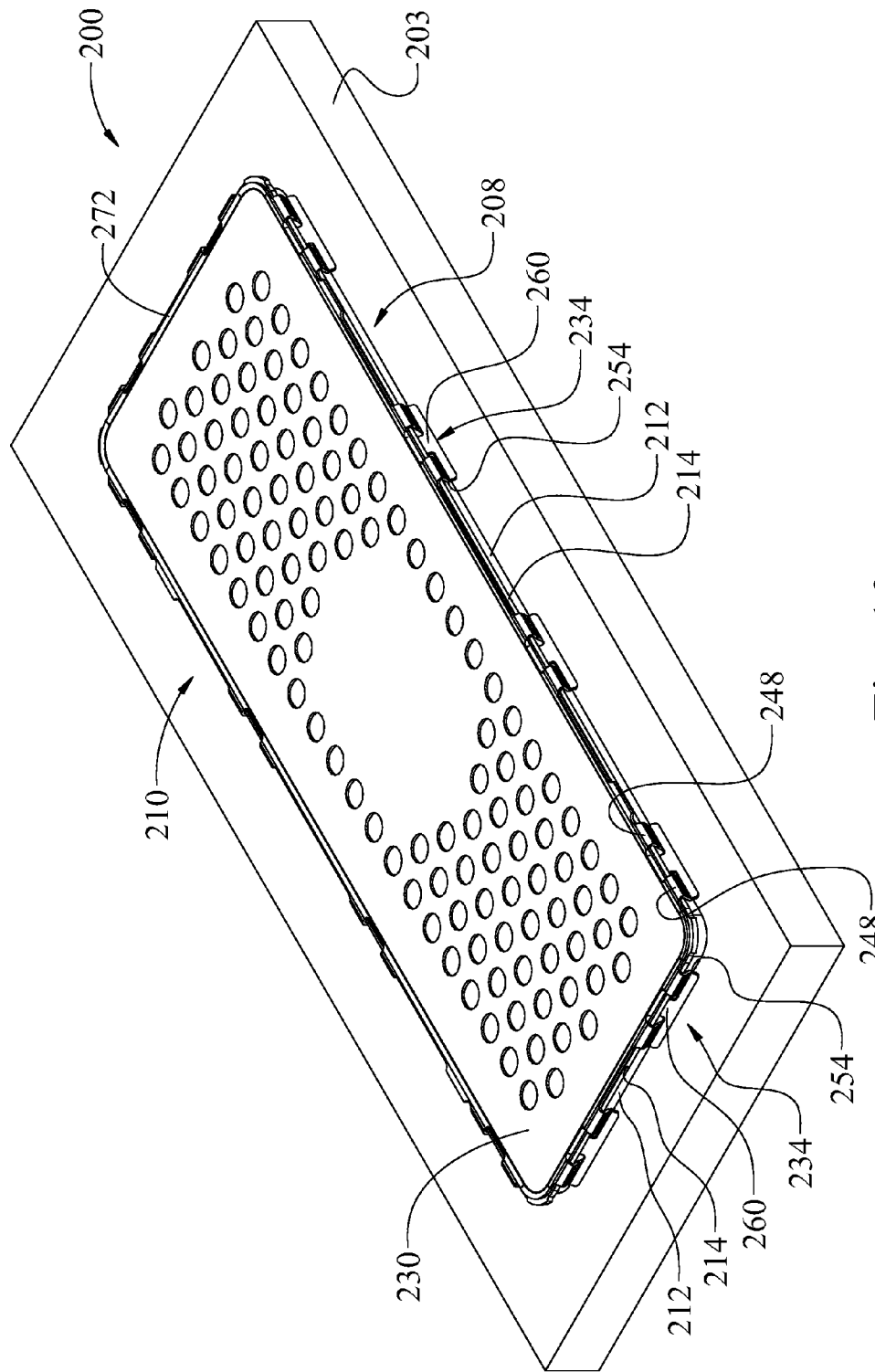
FIG. 10 is a perceptive view of another exemplary shielding apparatus mounted on a PCB according to another exemplary embodiment.
Figure 11:
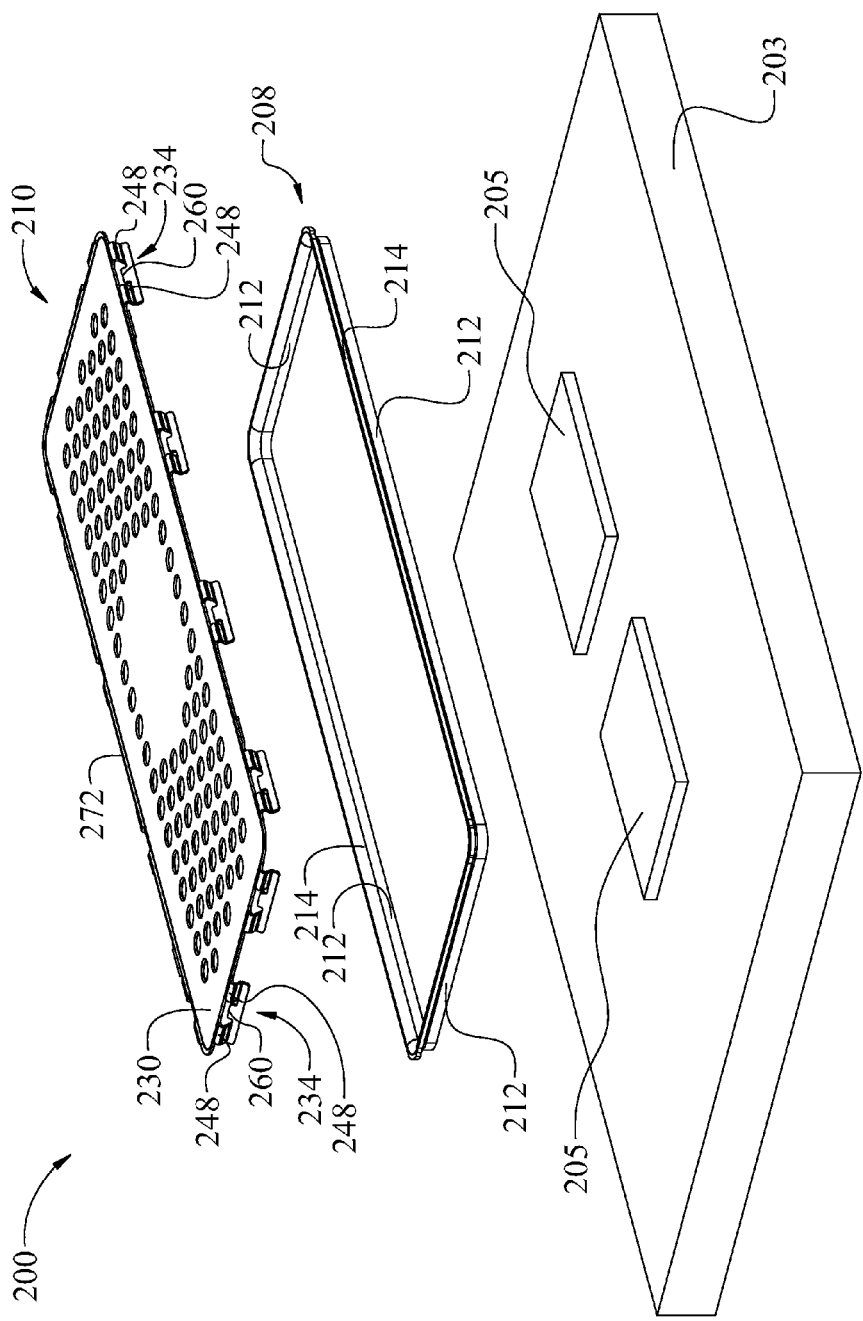
FIG. 11 is an exploded perspective view thereof.
Figure 12:
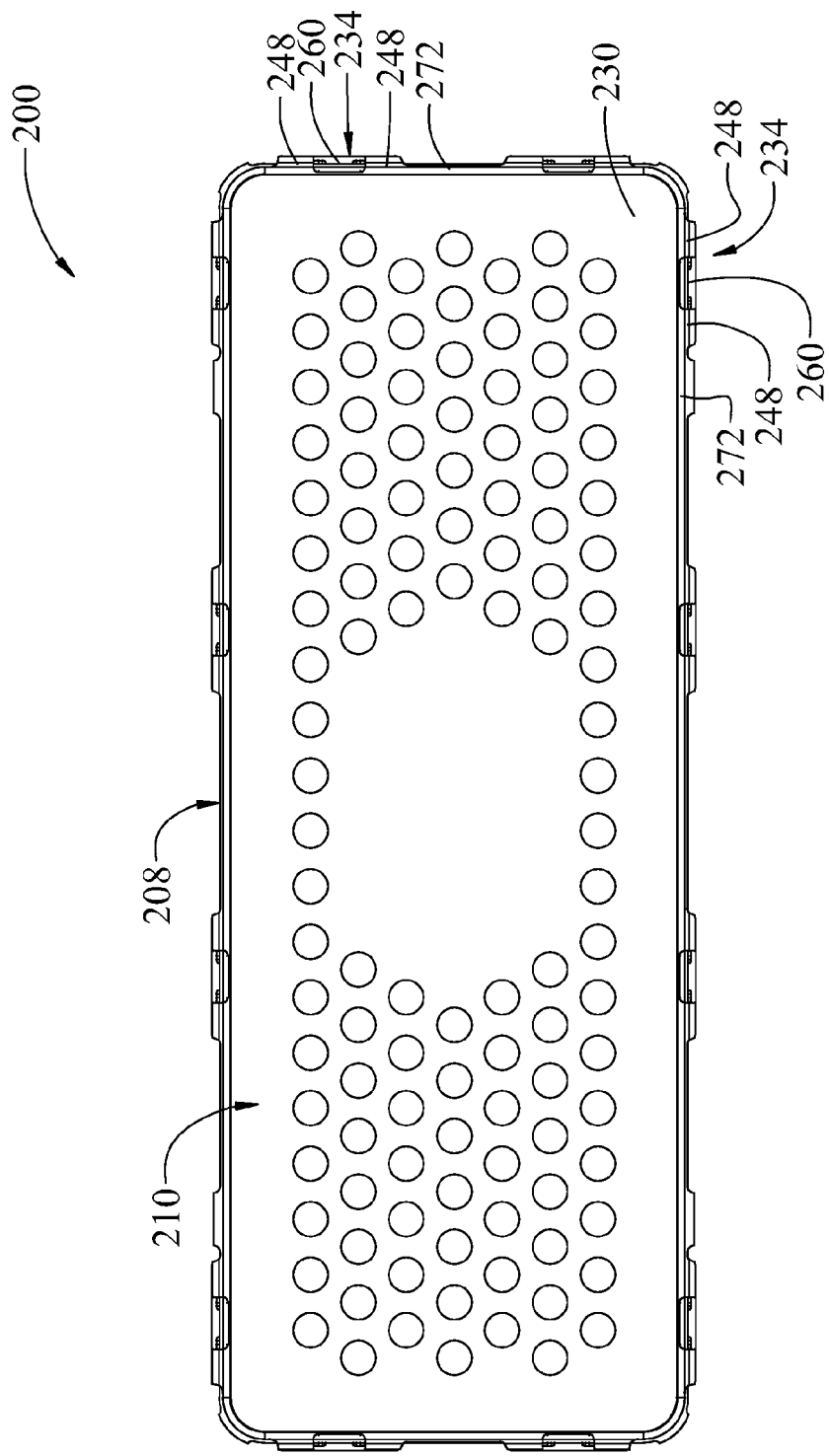
FIG. 12 is a top plan view of the shielding apparatus of FIG. 10 with the PCB removed.
Figure 13:
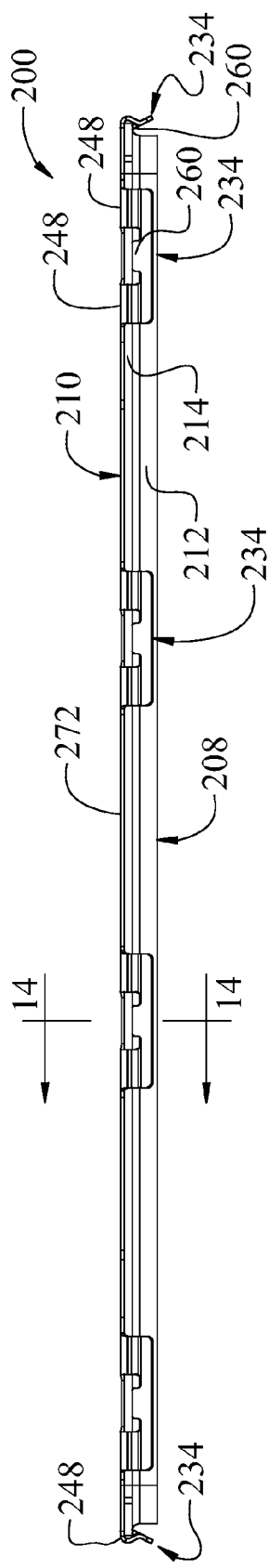
FIG. 13 is a side elevation view thereof.
Figure 14:
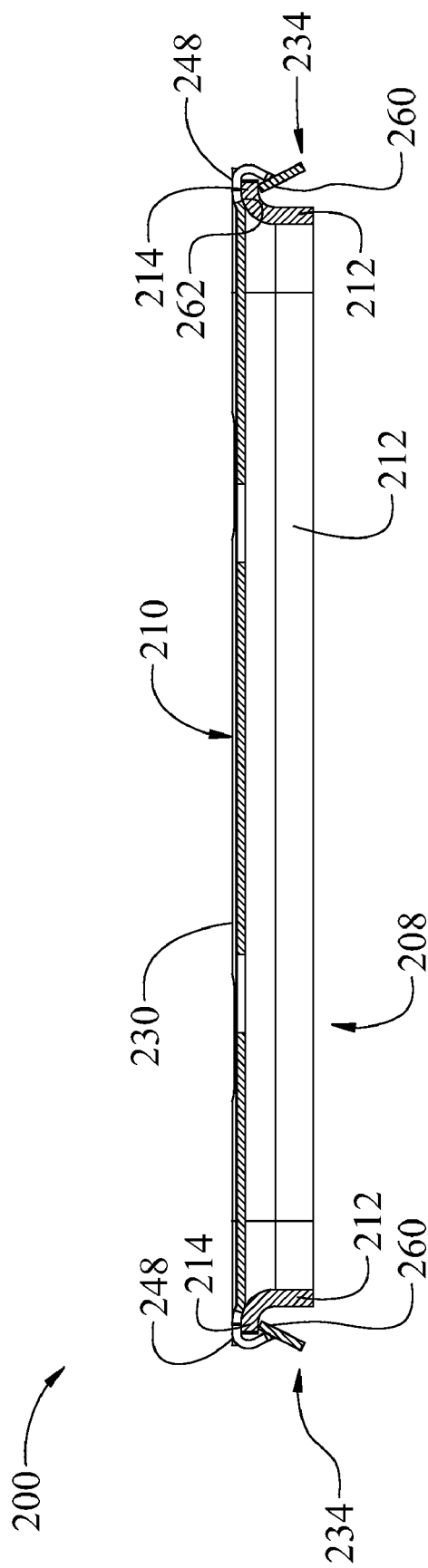
FIG. 14 is a section view of the shielding apparatus taken in a plane including line 14-14 of FIG. 13.

FIGS. 10 through 14 illustrate another exemplary embodiment of a shielding apparatus 200 having a drawn frame 208 and a cover 210 attachable to the frame 208. As shown in FIGS. 10 and 11, the shielding apparatus 200 may be installed to a PCB 203 and is suitable for use in providing EMI shielding to one or more electrical components 205 mounted on the PCB 203. The frame 208 is generally rectangular in shape and includes four side walls 212 and an upper lip 214 (FIG. 11) formed integrally (or monolithically) with the side walls 212.

In the current shielding apparatus 200, the frame's upper lip 214 is generally free of cutouts.

The cover 210 includes an upper surface 230 and multiple spaced apart retention members 234 extending generally downwardly from the upper surface 230. Upper portions 248 of the retention members 234 define, in part, a rim 272 that extends generally along a perimeter of the cover's upper surface 230. The upper surface 230 is recessed generally downwardly (or downwardly embossed) relative to the rim 272 so that, in this particular embodiment, the cover's upper surface 230 may broadly be viewed as a downward embossment. The illustrated cover 210 includes twelve retention members 234. However in other exemplary embodiments, shielding apparatus may include covers with more than or less than twelve retention members.

Reference will now be made to FIGS. 10 and 12 through 14 in which the cover 210 is shown attached to the frame 208. The retention members 234 of the cover 210 are positioned generally over the upper lip 214 of the frame so that knuckles 254 and retention tabs 260 of the retention members 234 are positioned generally under the frame's upper lip 214. Together, the knuckles 254 and retention tabs 260 cooperate to help hold the cover 210 in attachment with the frame 208. The upper lip 214 of the frame 208 is received generally into a guide 262 defined under the cover's rim 272 and generally outwardly of the cover's recessed upper surface 230. At least part of the frame's upper lip 214 may be in contact with the cover's recessed upper surface 230. Thus, the guide 262 frictionally receives the upper lip 214 of the frame 208 into the guide 262 to thereby help generally hold the cover 210 in electrical and physical contact with the frame 208.

Numerical dimensions and values are provided herein for illustrative purposes only. The particular dimensions and values provided are not intended to limit the scope of the present disclosure.

Certain terminology is used herein for purposes of reference only, and thus is not intended to be limiting. For example, terms such as "upper," "lower," "above," "below," "top," "bottom," "upward," "downward," "upwardly," and "downwardly" refer to directions in the drawings to which reference is made. Terms such as "front," "back," "rear," "bottom," and "side," describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first," "second," and other such numerical terms referring to structures do not imply a sequence or order unless clearly indicated by the context.

When introducing elements or features and the exemplary embodiments, the articles "a," "an," "the," and "said" are intended to mean that there are one or more of such elements or features. The terms "comprising," "including" and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order of performance. It is also to be understood that additional or alternative steps may be employed.

The description of the disclosure is merely exemplary in nature and, thus, variations that do not depart from the gist of the disclosure are intended to be within the scope of the disclosure. Such variations are not to be regarded as a departure from the spirit and scope of the disclosure.

What is claimed is:

1. A shielding apparatus suitable for use in providing electromagnetic interference shielding for one or more electrical components on a substrate, the shielding apparatus comprising:

a frame having side walls defining at least one opening along an upper portion of the frame, the frame being configured for installation to the substrate so that the side walls generally surround the one or more electrical components on the substrate; and a cover attachable to the frame for substantially covering the at least one opening defined by the frame;

the cover including an upper surface having an inverted embossment formed therein, and a cover member extending generally downwardly from the upper surface at a location adjacent the inverted embossment, the inverted embossment having generally opposing sides, the inverted embossment and cover member defining a guide for guiding and receiving at least part of the frame into the guide when the cover is attached to the frame;

wherein the inverted embossment of the cover includes a channel having a generally U-shaped profile, and wherein the channel is disposed along an entire perimeter of the upper surface of the cover;

whereby the guide is configured to help facilitate and generally hold the cover in electrical contact with the frame when the cover is attached to the frame, and whereby the shielding apparatus is operable for shielding the one or more electrical components on the substrate that are within an interior cooperatively defined by the frame, the cover, and the substrate;

wherein the frame includes a lip extending generally outwardly from one or more of the side walls of the frame, and wherein the guide of the cover is configured to receive the lip of the frame into the guide when the cover is attached to the frame to thereby help generally hold the cover in electrical contact with the frame.

2. The shielding apparatus of claim 1, wherein the lip of the frame received into the guide of the cover contacts at least part of the cover at the inverted embossment of the cover.

3. The shielding apparatus of claim 1, wherein the cover member of the cover includes an inwardly projecting knuckle, the knuckle extending at least partly under the lip of the frame to help retain the attachment of the cover to the frame.

4. The shielding apparatus of claim 3, wherein the lip of the frame includes a tab extending generally away from the lip, and wherein the cover member of the cover includes a retention member having an opening generally above the knuckle and extending through the retention member for receiving the tab therein to help retain the attachment of the cover to the frame.

5. The shielding apparatus of claim 1, wherein
the frame defines a single interior space for shielding the one or more electrical components on the substrate.

6. The shielding apparatus of claim 1, wherein the inverted embossment includes a bottom connected to the generally opposing sides of the inverted embossment, such that the bottom and the generally opposing sides cooperatively define a channel.

7. A shielding apparatus suitable for use in providing electromagnetic interference shielding for one or more electrical components on a substrate, the shielding apparatus comprising:

a frame having side walls defining at least one opening along an upper portion of the frame, the frame being configured for installation to the substrate so that the side walls generally surround the one or more electrical components on the substrate; and a cover attachable to the frame for substantially covering the at least one opening defined by the frame, the cover including an upper surface and a cover member extending generally downwardly from the upper surface;

the frame being at least partly drawn in construction and including a draw lip extending generally outwardly from one or more of the side walls; the draw lip configured for operatively engaging the cover member of the cover for releasably attaching the cover to the frame;

wherein the draw lip of the frame is monolithically formed with at least one of the side walls of the frame; and wherein the draw lip includes an outwardly directed tab oriented generally coplanar with the draw lip of the frame, the tab configured to cooperate with the cover member to help retain attachment of the cover to the frame;

whereby the shielding apparatus is operable for shielding the one or more electrical components on the substrate that are within an interior cooperatively defined by the frame, the cover, and the substrate; wherein the cover member of the frame includes an upper portion and a finger extending generally downwardly from the upper portion, the finger forming an angle with the upper portion that is less than about ninety degrees such that at least part of the finger may extend under the tab of the frame to help retain the attachment of the cover to the frame.

8. The shielding apparatus of claim 7, wherein the frame defines a single interior space for shielding the one or more electrical components on the substrate.

9. A shielding apparatus suitable for use in providing electromagnetic interference shielding for one or more electrical components on a substrate, the shielding apparatus comprising:

an electrically-conductive frame being at least partly drawn in construction and having side walls defining at least one opening along an upper portion of the frame, the side walls being monolithically formed with each other and free of openings at corners of the frame, the frame being configured for installation to the substrate so that the side walls generally surround the one or more electrical components on the substrate; and an electrically-conductive cover attachable to the frame for substantially covering the at least one opening defined by the frame, the cover including an upper surface and two or more spaced-apart cover members extending generally downwardly from the upper surface;

the frame including a lip extending generally outwardly from one or more of the side walls of the frame and substantially around the frame, the lip receiving at least part of each of the cover members under the lip for at least partly attaching the cover to the frame;

the cover including a recessed guide formed within an interior portion of the cover between the upper surface of the cover and the two or more spaced-apart cover members, the guide configured to receive at least part of the draw lip of the frame into the guide with at least part of the frame in contact with the upper surface of the cover;

wherein the lip of the frame includes a tab extending generally outwardly from the lip, and wherein at least one of the cover members of the cover includes an opening extending through the at least one of the cover members and configured to receive at least part of the tab into the opening and under at least part of the at least one of the cover members to help retain the attachment of the cover to the frame;

whereby the cover and the frame are in electrical contact when the cover is attached to the frame, and whereby the shielding apparatus is operable for shielding the one or more electrical components on the substrate that are within an interior cooperatively defined by the frame, the cover, and the substrate; wherein the lip of the frame includes two or more tabs, and wherein at least two of the cover members of the cover each includes an opening configured to receive a respective one of the two or more tabs to help retain the attachment of the cover to the frame.

10. The shielding apparatus of claim 9, wherein at least one of the cover members of the cover includes an inwardly projecting knuckle generally below the corresponding opening of the at least one of the cover members, the knuckle extending at least partly under the lip of the frame to at least partly attach the cover to the frame.

11. The shielding apparatus of claim 9, wherein at least one of the cover members of the cover includes a cam surface for use in attaching the cover to the frame and positioning the at least one of the cover members under the lip of the frame.

12. The shielding apparatus of claim 9, wherein the frame defines a single interior space for shielding the one or more electrical components on the substrate.

13. An electronic device including the shielding apparatus of claim 1.

14. An electronic device including the shielding apparatus of claim 7.

15. An electronic device including the shielding apparatus of claim 9.

16. The shielding apparatus of claim 1, wherein the shielding apparatus includes an overall height dimension of about 1.5 millimeters or less when the cover is attached to the frame.

17. The shielding apparatus of claim 1, wherein the frame includes an outwardly directed tab, and wherein the cover member of the cover includes an opening extending through the cover member configured to receive at least part of the tab to help retain attachment of the cover to the frame.

18. The shielding apparatus of claim 7, wherein the shielding apparatus includes an overall height dimension of about 1.5 millimeters or less when the cover is attached to the frame.

19. The shielding apparatus of claim 9, wherein the shielding apparatus includes an overall height dimension of about 1.5 millimeters or less when the cover is attached to the frame.

* * * * *